(12) United States Patent
Nygren

(10) Patent No.: US 6,924,675 B2
(45) Date of Patent: Aug. 2, 2005

(54) BUFFER DEVICE

(75) Inventor: Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 698 days.

(21) Appl. No.: 09/910,342

(22) Filed: Jul. 20, 2001

(65) Prior Publication Data

US 2002/0016936 A1 Feb. 7, 2002

(30) Foreign Application Priority Data

Jul. 20, 2000 (DE) .......................................... 100 35 424

(51) Int. Cl.[7] ............................. H03L 7/00; H03L 7/06
(52) U.S. Cl. ....................... 327/141; 327/144; 327/146
(58) Field of Search ................................ 327/276, 277, 327/379, 386, 141, 155, 161, 144, 146

(56) References Cited

U.S. PATENT DOCUMENTS 5,424,590 A * 6/1995 Sato et al. ................... 327/273
5,670,904 A * 9/1997 Moloney et al. ............. 327/277
6,169,438 B1 * 1/2001 Wu et al. ..................... 327/276
6,606,361 B1 * 8/2003 Rowell ........................ 375/355

FOREIGN PATENT DOCUMENTS

DE 197 47 249 A1 4/1999
DE 197 36 434 C2 6/1999

* cited by examiner

Primary Examiner—Tuan T. Lam
(74) Attorney, Agent, or Firm—Laurence A. Greenberg; Werner H. Stemer; Ralph E. Locher

(57) ABSTRACT

A buffer device includes a plurality of latch stages which each have a latch device and a multiplexer. At least the multiplexer of the first latch stage on the output side is associated with a feedback loop of the latch device of this latch stage. The feedback loop is provided for data buffering. The buffer device keeps a data output on an output line stable.

20 Claims, 3 Drawing Sheets

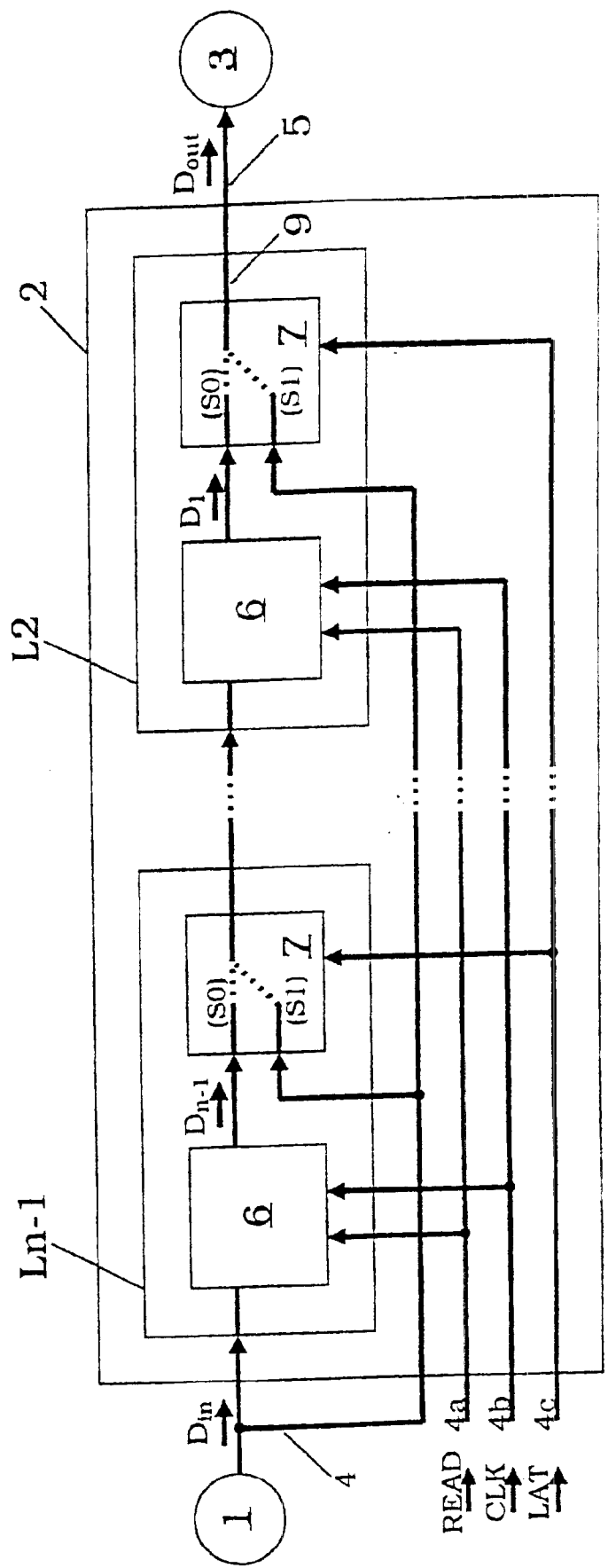
Fig_3
Prior Art

BUFFER DEVICE

BACKGROUND OF THE INVENTION

Field of the Invention

The invention relates to a buffer device for receiving and buffering input data and for outputting output data which correspond to the input data.

When digital data are exchanged between a transmitting device and a receiving device, a buffer device is often provided in the transmission channel. This buffer device is used to collect and buffer the data transferred from the transmitting device and to output the buffered data to the receiving device, specifically in such a way that takes the different time structures of the transmitting device and the receiving device into account. Known buffer devices are thus embodied between transmitting and receiving units in order to bring about a synchronicity between the emitted data stream, the passed-on data stream and then finally the received data stream.

Because different system requirements make different speeds of data output to the receiving unit or device necessary, known buffer devices are configured as so-called FIFO (first-in first-out) latches. These known FIFO latches output the received data to the receiving device in the order in which they are also received, and in accordance with a predefinable latency, latency time or delay time after reception by the transmitting device. The buffered data are held at the output in each case until the receiving unit is ready for reception and receives the data from the buffer.

Accordingly, known buffer devices are configured for receiving and buffering input data fed to an input line device and for outputting output data, which correspond essentially to the input data, onto an output line device, and can be selected for this purpose with respect to the latency or delay time until the outputting of data. These known buffer devices each have a plurality of what are referred to as latch stages, that is to say data holding stages which themselves each include at least one latch device, the actual buffer, and a multiplexer. The multiplexer is provided and embodied in each case in the respective latch stage in such a way that a respective data output terminal of the latch stage can be supplied, in a controllable fashion, at least either directly with the input data present at the input line device of the buffer device in a first selection state of the multiplexer, or with the data buffered in the latch device of the respective latch stage in a second selection state of the multiplexer.

The entire externally effective latency, is thus defined through the use of the controllable selection of the multiplexers of the entirety of latch stages. Each latch stage in itself brings about a certain latency time, latency or delay time due to the series configuration of the latch device and multiplexer. The configuration of the successive latch stages in series then brings about, depending on the selection of the activated multiplexers, the selection of a specific latency so that, when n−1 latch stages n are connected in series, different latencies can be selected.

During the buffering, in particular with selectable, different latencies or delays, the output data on the output line device must be kept stable, irrespective of which latency has been selected, even if no activation command or read instruction accesses the latch devices and even if the first multiplexer on the output side, that is to say the latency 1, has been selected, at which latency in known buffer devices there is no further following latch device which could keep the present output data stable.

SUMMARY OF THE INVENTION

It is accordingly an object of the invention to provide a buffer device which overcomes the above-mentioned disadvantages of the heretofore-known buffer devices of this general type and which ensures in a particularly easy way that output data which are present on the output line device are kept stable for any selected latency and irrespective of the presence of an activation state of the latch devices.

With the foregoing and other objects in view there is provided, in accordance with the invention, a buffer device, including:

an input line device for receiving input data;

a plurality of latch stages connected to the input line device, each of the latch stages including at least a latch device, a multiplexer, and a data output terminal;

the multiplexer having at least a first selection state and a second selection state, and the multiplexer being provided and configured in a respective one of the latch stages and being controllable such that the data output terminal is selectively supplied directly with the input data present at the input line device, when the multiplexer is in the first selection state, and the data output terminal is supplied with data buffered in the latch device, when the multiplexer is in the second selection state, for providing data with one of a selectable latency and a selectable delay;

an output line device for outputting output data corresponding to the input data;

the latch device of a first one of the latch stages, as seen from the output line device, having a feedback loop for data buffering; and the multiplexer of the first one of the latch stages being associated with the feedback loop and being configured such that the output data on the output line device can be kept stable.

In other words, according to the invention, a buffer device for receiving and buffering input data fed to an input line device and for outputting output data, corresponding to the input data, on an output line device with selectable latency or delay, includes:

a plurality of latch stages which each have at least a latch device and a multiplexer, and the multiplexer being provided and embodied in each case in the respective latch stage in such a way that a respective data output terminal of the latch stage can be supplied, in a controllable fashion, at least either directly with the input data present at the input line device of the buffer device in a first selection state of the multiplexer, or with the data buffered in the latch device of the respective latch stage in a second selection state of the multiplexer, wherein at least the multiplexer of the first latch stage on the output side is embodied integrated in the region of a feedback loop, provided for data buffering, of the latch device of this latch stage in such a way that data which is output on or present at the output line device can be kept stable there, in particular irrespective of the activation state of the latch devices of the latch stages and/or of a current change in the input data.

In the prior art, an additional latch mechanism is provided in the buffer device either for the input signal or for the output signal in order to avoid the problem of instability of the output signal for a selected latency 1. This has the disadvantages of additional power drain and of generating additional noise on the lines. In addition, the output data of the output data line is in an unpredictable state if there is overall no activation signal for the individual preceding latch devices. Furthermore, corresponding electronic components for the additional latch mechanism and a data path are provided which require space on the integrated module and impair the performance, in particular the speed, of the buffer device.

A basic idea of the present invention is, on the other hand, that a multiplexer which is to be provided in any case, in particular that of the first latch stage on the output side, is embodied in the region of a feedback loop of the latch device, the feedback loop being provided for data buffering. This ensures that the selection of the multiplexer is made in the feedback loop which is provided for buffering in any case, as a result of which the latch mechanism which is present there or the latch device is also used for buffering and for stabilization. As a result, on the output side of the first latch device, the data signal remains stable on the output line device, specifically irrespective of whether the latency has been selected, which latency has been selected, and also irrespective of whether or not any of the latch devices has been activated to read out by an appropriate activation command.

For this purpose, it is advantageous that each latch stage in itself has at least one data input terminal and one data output terminal. The latch stages are also provided essentially in series in such a way that the data output terminal of a respective preceding latch stage is connected in each case to the data input terminal of a directly following latch stage from the input line device to the output line device of the buffer devices. This configuration ensures in particular that the series configuration of the successive latch stages defines the cascading and succession of the selectable latencies.

Although it is basically sufficient that, in order to stabilize the output signal present on the output line device, firstly only the multiplexer of the first latch stage on the output side is embodied in the latch device, specifically in particular in a feedback loop provided there for buffering purposes, it is particularly advantageous for reasons of production technology and configuration if all the latch stages, in particular on the configuration of the multiplexers, are of essentially identical or identically acting configuration. This measure therefore provides for all the multiplexers of the latch stages to be provided in each case integrated into the latch devices, and in particular in a feedback loop provided there in each case.

To select the multiplexer, it is particularly advantageous if the multiplexer is configured in each case to receive a selection signal, in particular to select a latency or delay. Through the use of this selection signal it is then possible to transfer the respective multiplexer at least into the first and/or the second selection state. Here, the first selection state means, for example, bypassing the actual latch device and the data buffered in it and receiving and passing on the input data directly from the input line device, as a result of which the latency time assigned to the multiplexer selected in this way is then set. The second state of the respective multiplexer then, for example, correspondingly means that the buffered data of the corresponding assigned latch device is fed to the data output terminal of the latch stage to be passed on.

In a further embodiment of the buffer device according to the invention, each of the latch devices of the latch stages is advantageously configured in each case to receive a read signal or activation signal. As a result of the reception of the read signal or activation signal, the respective latch device of the latch stage can be activated, in particular to output the data buffered in it to the respective output data terminal of the latch stage.

For the ordered sequencing of the buffering process there it is also advantageous for the latch device and/or the multiplexer of a latch stage each to be configured to receive a clock signal. The processing, and in particular the passing-on of the buffer data, is then controlled in each case through the use of the clock signal which is present in any case for processing the data between the transmitting and receiving devices. The latencies can then essentially be conceived of as integer multiples of the clock time.

According to a preferred embodiment of the buffer device according to the invention, in each case a line device is provided for feeding the input data signal, the activation signal or read signal, the selection signal and/or the clock signal in each latch stage, in particular in each latch device.

The latch device of the latch stage is advantageously embodied in each case as a flipflop device, in particular as a D-flipflop or the like. Basically, all the forms and structures of D-flipflops, based on NAND or NOR gates, are conceivable here.

It is also advantageous that the selection possibilities of the latencies or delay times can be defined by the series configuration of the latch devices and in particular by the series configuration of the flipflop devices and/or by the succession of the selection signals. When n–1 latch stages connected in series are present, a selection of n latencies is obtained. If all the multiplexers are in the nonactive state, i.e. for example in the second state according to the definition, all the latch devices in the latch stage are connected in series and there is a maximum latency which includes at least the sum of the individual latencies of the individual latch stages. If, on the other hand, one of the multiplexers is activated by an appropriate selection signal and transferred into the first state in which the latch device of the associated latch stage and all the preceding latch stages on the input side are bypassed, exclusively the latencies of the following, remaining latch stages are added to form the composite latency. If exclusively the multiplexer of the first latch stage on the output side is transferred into this activated, first state, all the latch stages are bypassed and the input data signal appears essentially without latency or delay as an output data signal at the output line device, in which case, however, it is ensured that these output data signals are correspondingly held in a stable fashion at the output line device due to the integration of this first multiplexer into a region of a feedback loop provided for buffering, due to the feedback which then occurs. A particularly simple embodiment of the buffered device according to the invention is obtained if at most one of the multiplexers of the latch stages can be switched into a second selection state, namely the activated state, by the selection signals.

Other features which are considered as characteristic for the invention are set forth in the appended claims.

Although the invention is illustrated and described herein as embodied in a buffer device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic block diagram of a conventional buffer device.

DESCRIPTION OF THE PREFERRED EMBODIMENTS

Figure 1:
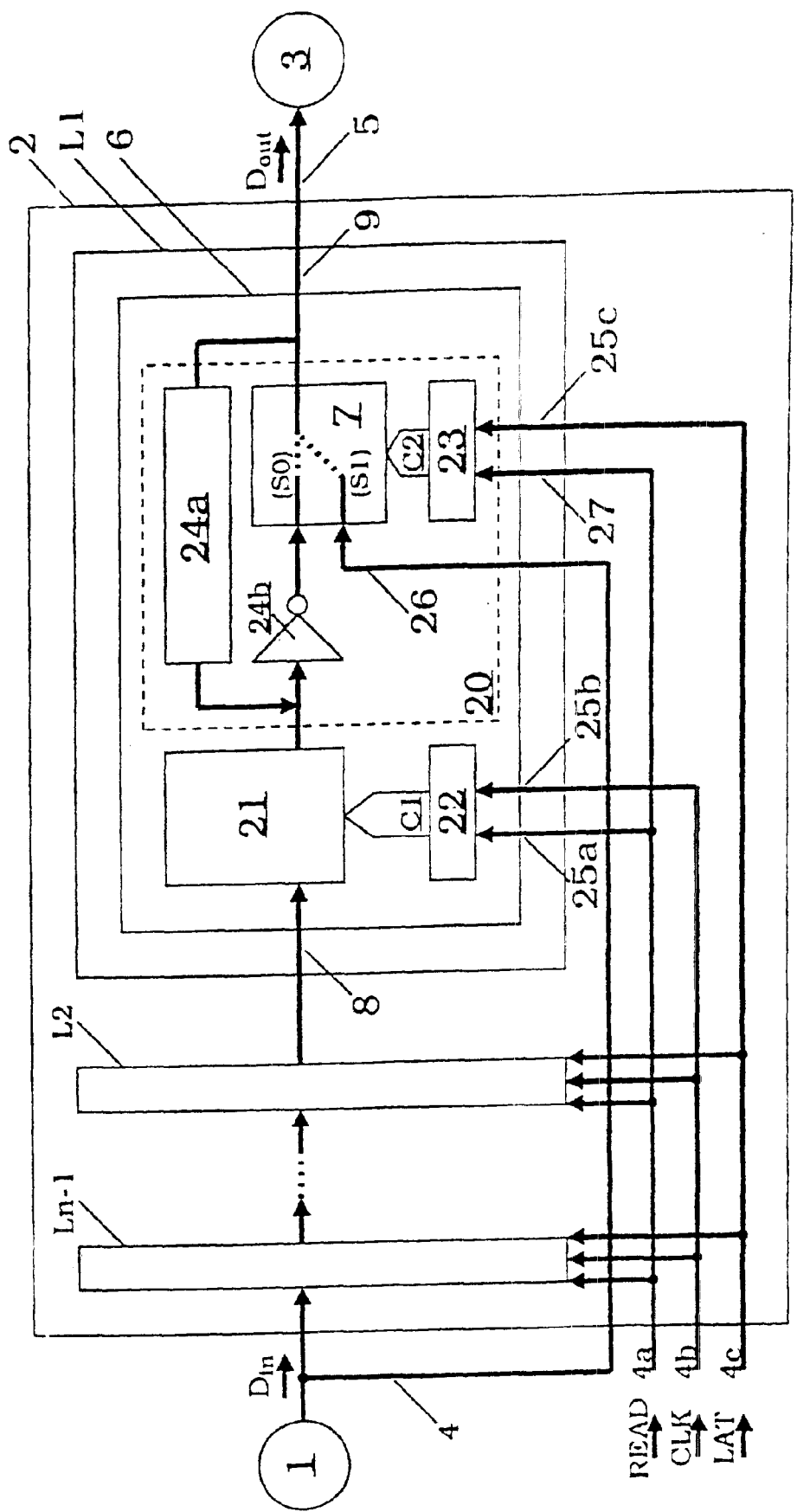
FIG. 1 is a schematic block diagram of a first embodiment of the buffer device according to the invention.

Referring now to the figures of the drawings in detail and first, particularly, to FIG. 1 thereof, there is shown an embodiment of the buffer device 2 according to the invention. The buffer device 2 has only a modified first latch stage L1 with a latch device 6 in which the actual multiplexer 7 of this first latch stage L1 is constructed in an integrated fashion in a region 20 of a feedback loop provided for buffering.

From a transmitting device 1, input data $D_{in}$ are fed via an input line device 4 of the buffer device 2. The data passes through latch stages Ln-1 to L2 which are if appropriate connected upstream and may be of conventional configuration. On the output side there is then the first latch stage L1 which is developed according to the invention as has already been described above. The output data $D_{out}$ are made available by this first latch stage L1 via the corresponding data output terminal 9 on the output line device 5 of the receiving device 3.

If appropriate, data of the following latch stage L2 are fed to the latch device L1 via a data input terminal 8. The buffering configuration in the latch device of the latch stage L1 is composed essentially of two feedback circuits 20 and 21, it being possible for the first feedback circuit 21 to be of conventional configuration and to be controlled through the use of a logic 22 which receives a clock signal CLK via a clock line 25b and an activation/read signal READ via a line 25a and further processes the latter to form a control signal C1 for the feedback circuit 21.

The second feedback circuit 20 can be essentially formed with a feedback element 24a and an inverter 24b, in a way analogous to the first feedback circuit 21, but the multiplexer 7 is introduced into the path in the region 20 of the second feedback loop, specifically in such a way that in the non-activated state S0 of the multiplexer the latch device 6 of the first latch stage L1 operates in a conventional fashion. In contrast, when the activated state S1 of the multiplexer 7 provided in the latch device 6 of the first latch stage L1 is formed, the latch device 6 is essentially bypassed and the input data signal $D_{in}$ present at the buffer device 2 is directly fed to the output data terminal 9 of the first latch stage L1 via a line 26. The multiplexer 7 of the first latch stage L1 is controlled via a logic 23 which generates a control signal C2 for the multiplexer 7 by processing a selection signal LAT via a line device 25c, and if appropriate the read/activation signal READ via a line 27.

Line devices 4, 4a, 4b and 4c for the input data $D_{in}$, the read/activation signal READ, the clock signal CLK and/or the selection signal for the latency LAT are provided within the buffer device 2.

Figure 2:
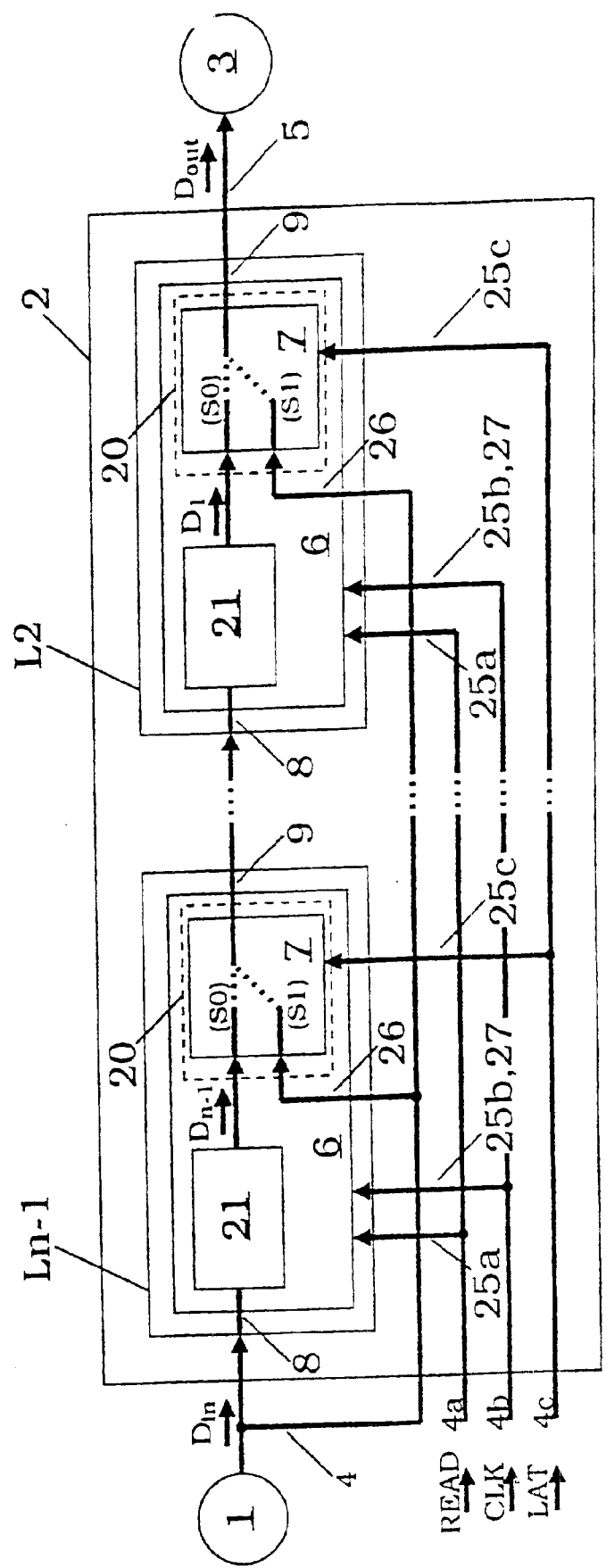
FIG. 2 is a schematic block diagram of another embodiment of the buffer device according to the invention.

The exemplary embodiment of the buffer device according to the invention which is shown in FIG. 2 has n-1 identical latch stages L2 to Ln-1 which all have the structure of the latch stage L1 shown in FIG. 1 and are illustrated only schematically here. The signals $D_{in}$, READ, CLK and/or LAT are fed via lines 4, 4a, 4b and 4c and via corresponding taps 25a, 25b, 25c, 26 and 27 to the respective latch devices 6 and to the multiplexers 7 integrated therein.

The multiplexers 7 of the latch stages L2 to Ln-1 of the embodiment in FIG. 2 according to the invention are each integrated into regions 20 of feedback loops provided for buffering in the latch devices 6. These regions 20 of the feedback loops are illustrated only schematically in the embodiment in FIG. 2.

By setting one of the signals or signal components LAT1 to LATn-1 at most one of the multiplexers 7 is transferred into an activated state S1 so that the latch devices 6 of the assigned latch stage and of all the preceding latch stages on the output side are bypassed so that the input data signal $D_{in}$ is present directly at the following latch stage on the input side or its data input terminal 8. If, therefore, the multiplexer 7 of the latch device 6 of the latch stage Lj is transferred into an activated state S1 by an activating signal LATj, this selection selects the latency j-1 which is made up essentially as a sum of the latencies or delay times of the output-side latch stages L1 to Lj-1 which precede viewed from the latch stage Lj.

In comparison thereto, FIG. 3 shows a buffer device 32 from the prior art. It also has n-1 latch stages L1 to Ln-1 connected in series. All the latch stages L1 to Ln-1 are of identical configuration, specifically in contrast to the procedure according to the invention with a latch device 6 and multiplexer 7 which are connected essentially in series. As a result of this configuration, in particular with regard to the first latch stage L1 located on the output side, it is not possible to keep the output data signal $D_{out}$ on the output line device 5 stable if the multiplexer 7 is set to bypass all the latch stages L1 to Ln-1 or their latch devices 6 by activating the selection signal LAT1. Then, the input data signal $D_{in}$ is in fact directly present at the output line device 5 so that a change in the input data signal $D_{in}$ due to the absence of buffering is manifest as an essentially instantaneous, corresponding change in the output data signal $D_{out}$.

In contrast thereto, the procedure according to the invention, namely the at least partial integration of the multiplexer into the latch device of the first latch stage located on the output side, ensures that the output data $D_{out}$ is stabilized, specifically without the requirement of an additional latch mechanism with the associated waste of space and energy resources.

I claim:

1. A buffer device, comprising:
   an input line device for receiving input data;
   a plurality of latch stages connected to said input line device, each of said latch stages including at least a data input terminal, a latch device, a multiplexer, and a data output terminal;
   said multiplexer having at least a first selection state and a second selection state, and said multiplexer being provided and configured in a respective one of said latch stages and being controllable such that either said data output terminal is selectively supplied directly with the input data present at said input line device, when said multiplexer is in the first selection state, or said data output terminal is supplied with data buffered in said latch device, when said multiplexer is in the second selection state, for providing data with one of a selectable latency and a selectable delay;
   an output line device for outputting output data corresponding to the input data;
   said latch device of a first one of said latch stages, as seen from said output line device, having a feedback loop for data buffering; and
   said multiplexer of said first one of said latch stages being associated with said feedback loop and being configured such that the output data on said output line device are kept stable.

2. The buffer device according to claim 1, wherein said multiplexer of said first one of said latch stages is configured such that the output data on said output line device are kept stable irrespective of an activation state of said latch device in said latch stages.

3. The buffer device according to claim 1, wherein said multiplexer of said first one of said latch stages is configured such that the output data on said output line device are kept stable irrespective of a current change in the input data.

4. The buffer device according to claim 1, wherein each of said latch stages has at least one said data input terminal.

5. The buffer device according to claim 4, wherein said latch stages are provided substantially in series such that, from said input line device to said output line device, said data output terminal of a respective preceding one of said latch stages is connected to said at least one data input terminal of a directly following one of said latch stages.

6. The buffer device according to claim 1, wherein all of said latch stages have a substantially identical configuration.

7. The buffer device according to claim 1, wherein all of said latch stages operate in substantially a same manner.

8. The buffer device according to claim 1, wherein said multiplexer in each of said latch stages has a substantially identical configuration.

9. The buffer device according to claim 1, wherein said multiplexer is configured to receive a selection signal, said multiplexer is selectively brought into at least the first selection state and the second selection state with the selection signal.

10. The buffer device according to claim 9, wherein said multiplexer receives the selection signal in order to select one of a latency and a delay time.

11. The buffer device according to claim 1, wherein said latch device of said latch stages is in each case configured to receive a read signal for activating said latch device.

12. The buffer device according to claim 11, wherein said latch device is activated with the read signal in order to output data buffered in said latch device to said data output terminal of a respective one of said latch stages.

13. The buffer device according to claim 1, wherein at least one element selected from the group consisting of said latch device and said multiplexer of a respective one of said latch stages is configured to receive a clock signal for controlling a processing.

14. The buffer device according to claim 1, including a line device in each of said latch stages for feeding at least one signal selected from the group consisting of an input data signal, an activation signal, a selection signal and a clock signal.

15. The buffer device according to claim 1, wherein said line device is provided in said latch device of each of said latch stages.

16. The buffer device according to claim 1, wherein said latch device is a flipflop device.

17. The buffer device according to claim 1, wherein said latch device is a D-flipflop.

18. The buffer device according to claim 1, wherein said latch stages are configured such that at least one of a given sequence of said latch device of said latch stages and a selection signal defines selection possibilities for one of latencies and delay times.

19. The buffer device according to claim 16, wherein said latch stages are configured such that at least one of a given sequence of said flipflop device of said latch stages and a selection signal defines selection possibilities for one of latencies and delay times.

20. The buffer device according to claim 1, wherein said multiplexer of at most one of said latch stages is configured such that selection signals bring said multiplexer into the second selection state.

* * * * *